(12) United States Patent
Yang

(10) Patent No.: US 8,796,562 B2
(45) Date of Patent: Aug. 5, 2014

(54) COMBINER BOX

(76) Inventor: Chi-Jen Yang, Tainan (TW)

( * ) Notice: Subject to any disclaimer, the term of this patent is extended or adjusted under 35 U.S.C. 154(b) by 354 days.

(21) Appl. No.: 13/442,976

(22) Filed: Apr. 10, 2012

(65) Prior Publication Data

US 2013/0094124 A1  Apr. 18, 2013

(30) Foreign Application Priority Data

Oct. 18, 2011 (TW) .............................. 100219485 A

(51) Int. Cl.
| | |
|---|---|
| *H01L 23/495* | (2006.01) |
| *H02G 3/16* | (2006.01) |
| *H01L 31/048* | (2014.01) |
| *H02G 3/08* | (2006.01) |
| *H02B 1/20* | (2006.01) |
| *H01R 13/502* | (2006.01) |
| *H01R 13/46* | (2006.01) |

(52) U.S. Cl.
CPC .............. *H01L 31/0485* (2013.01); *H02G 3/16* (2013.01); *Y02E 10/50* (2013.01); *H02G 3/08* (2013.01)
USPC ................. 174/537; 174/59; 174/63; 174/64; 174/549; 361/636; 361/656; 361/673; 361/601; 439/701

(58) Field of Classification Search
USPC ............ 361/600–678; 174/50–64; 307/43–87
See application file for complete search history.

(56) References Cited

U.S. PATENT DOCUMENTS

| 8,684,758 | B2 * | 4/2014 | Gharabegian et al. ......... 439/212 |
| 2004/0147172 | A1 * | 7/2004 | Brown et al. .................. 439/701 |
| 2011/0308833 | A1 * | 12/2011 | West ........................... 174/50.52 |
| 2012/0048328 | A1 * | 3/2012 | Solon ............................ 136/244 |
| 2013/0207678 | A1 * | 8/2013 | DeBone et al. ............... 324/713 |

FOREIGN PATENT DOCUMENTS

| DE | 102011119173 | * 11/2011 |
| EP | 1777754 A1 * | 4/2007 |
| EP | 2584615 * | 4/2013 |
| FR | 2879308 A1 * | 6/2006 |

OTHER PUBLICATIONS

SOLARLOK 5-String Combiner Box PDF published Mar. 24, 2011.*

* cited by examiner

*Primary Examiner* — Zachary M Pape
(74) *Attorney, Agent, or Firm* — Shook, Hardy & Bacon, LLP

(57) ABSTRACT

A combiner box includes a combiner module and an electrical connector unit disposed in a casing. The combiner module includes an insulating board, and plural first and second input electrodes disposed on opposite surfaces of the insulating board along a first direction and corresponding respectively to plural first and second input sockets of the casing. The second input sockets are disposed below and alternatingly arranged with the first input sockets along the first direction. The electrical connector unit includes plural first and second input terminals disposed in the first and second input sockets and electrically connected to the first and second input electrodes, respectively.

13 Claims, 11 Drawing Sheets

COMBINER BOX

CROSS-REFERENCE TO RELATED APPLICATION

This application claims priority of Taiwanese Application No. 100219485, filed on Oct. 18, 2011.

BACKGROUND OF THE INVENTION

1. Field of the Invention

The present invention relates to a combiner box, more particularly to a combiner box for combining multiple current inputs into one current output.

2. Description of the Related Art

In solar energy generation, the combiner box is an electrical distribution box used for combining multiple direct-current (DC) inputs coming from respective solar panels so as to convert the DC inputs into one DC output. For example, FIG. 1 illustrates a conventional combiner box 1 including a waterproof casing 11, a surge protector 12, a plurality of fuses 13, a plurality of input terminal blocks 14, a plurality of input connectors 15, a pair of output connectors 16, a DC breaker 17, and a conducting wire unit 18.

The waterproof casing 11, for example, satisfies an ingress protection rating (IP65) defined in international standard IEC 60529, and includes a bottom wall 111, a surrounding wall 112 projecting from and peripherally surrounding the bottom wall 111, and a plurality of mounting rails 113 disposed on the bottom wall 111. The surge protector 12, the fuses 13, the input terminal blocks 14 and the DC breaker 17 are mounted at the mounting rails 113 in the waterproof casing 11. The conducting wire unit 18 includes a plurality of input wires 181 electrically connecting the input connectors 15 to the fuses 13 and the input terminal blocks 14, a plurality of combining wires 182 electrically connecting the fuses 13 and the input terminal blocks 14 to the DC breaker 17, and a pair of output wires 183 electrically connecting the DC breaker 17 to the output connectors 16.

Regarding installation of the conventional combiner box 1, it is necessary to determine appropriate types and numbers of the surge protector 12, the fuses 13, the input terminal blocks 14 and the DC breaker 17, and to determine a size of the waterproof casing 11 accordingly. Then, the surge protector 12, the fuses 13, the input terminal blocks 14 and the DC breaker 17 are mounted on the mounting rails 113 of the waterproof casing 11, and a plurality of holes are formed through the surrounding wall 112 of the waterproof casing 11 for mounting the input connectors 15 and the output connecters 16 therethrough. After mounting the input connectors 15 and the output connecters 16 on the surrounding wall 112, the conventional combiner box 1 is provided with the input wires 181, the combining wires 182 and the output wires 183 for electrically connecting related components thereof.

The conventional combiner box 1 includes a relatively large number of the input terminal blocks 14, and therefore, a manufacturing cost of the conventional combiner box 1 is relatively high. Further, an electrical technician is required for wiring the conventional combiner box 1 and the wiring operation is a relatively complicated process. As a result, there is a high risk of human error during installation of the conventional combiner box 1, and the installation is time-consuming so that labor-related costs are high.

SUMMARY OF THE INVENTION

Therefore, an object of the present invention is to provide a combiner box that is relatively easy to install and that is less expensive to manufacture.

Accordingly, a combiner box of the present invention comprises a casing, a combiner module, and an electrical connector unit.

The casing includes a bottom wall and a surrounding wall cooperatively defining an accommodating space. The surrounding wall is formed with a plurality of first input sockets, a plurality of second input sockets, a first output socket and a second output socket. The first and second input sockets are spaced apart from each other and are arranged along a first direction parallel to the surrounding wall. The second input sockets are disposed at a level between the first input sockets and the bottom wall and are alternatingly arranged with the first input sockets along the first direction.

The combiner module is disposed in the accommodating space of the casing over the bottom wall, and includes an electrically insulating board, a first electrode set, and a second electrode set. The electrically insulating board has a first surface, a second surface opposite to the first surface, and a first side connected between the first and second surfaces and extending along the first direction. The first electrode set is disposed over the first surface of the electrically insulating board, and includes a plurality of first input electrodes and a first output electrode. The first input electrodes are spaced apart from each other, are arranged along the first direction, and correspond to the first input sockets of the surrounding wall, respectively. The first output electrode is electrically connected to the first input electrodes and corresponds to the first output socket of the surrounding wall. The second electrode set is disposed on the second surface of the electrically insulating board, and includes a plurality of second input electrodes and a second output electrode. The second input electrodes are spaced apart from each other, are arranged along and partially cover the first side of the electrically insulating board, are disposed below the first input electrodes with respect to the electrically insulating board, and correspond to the second input sockets of the surrounding wall, respectively. The second output electrode is electrically connected to the second input electrodes and corresponds to the second output socket of the surrounding wall.

The electrical connector unit includes a plurality of first input terminals, a plurality of second input terminals, a first output component, and a second output component. The first input terminals are disposed in the first input sockets and are electrically connected to the first input electrodes, respectively. The second input terminals are disposed in the second input sockets and are electrically connected to the second input electrodes, respectively. The first and second output components correspond to the first and second output sockets and are electrically connected to the first and second output electrodes, respectively.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
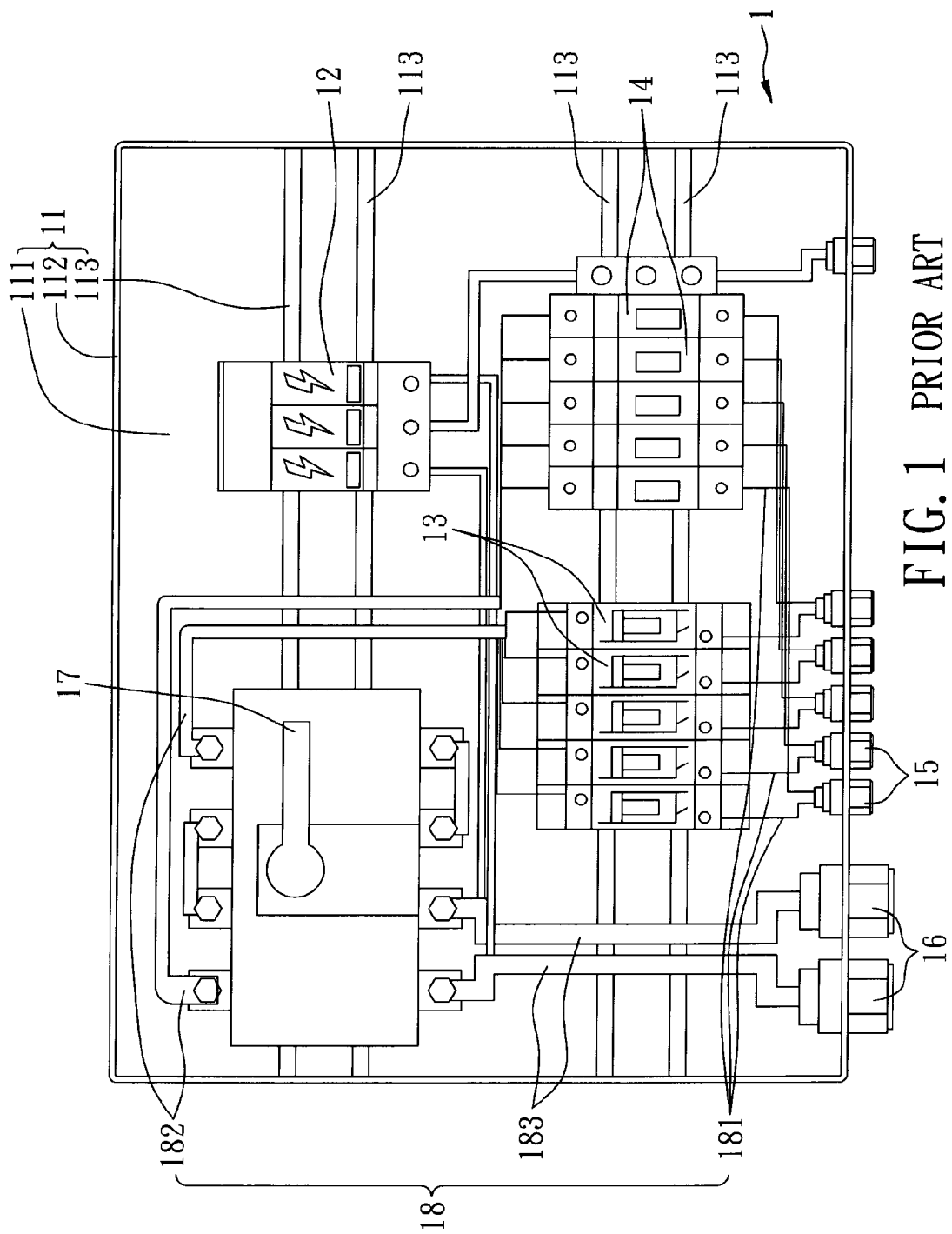
FIG. 1 is a schematic view illustrating a conventional combiner box.

Before the present invention is described in greater detail, it should be noted that like elements are denoted by the same reference numerals throughout the disclosure.

Figure 2:
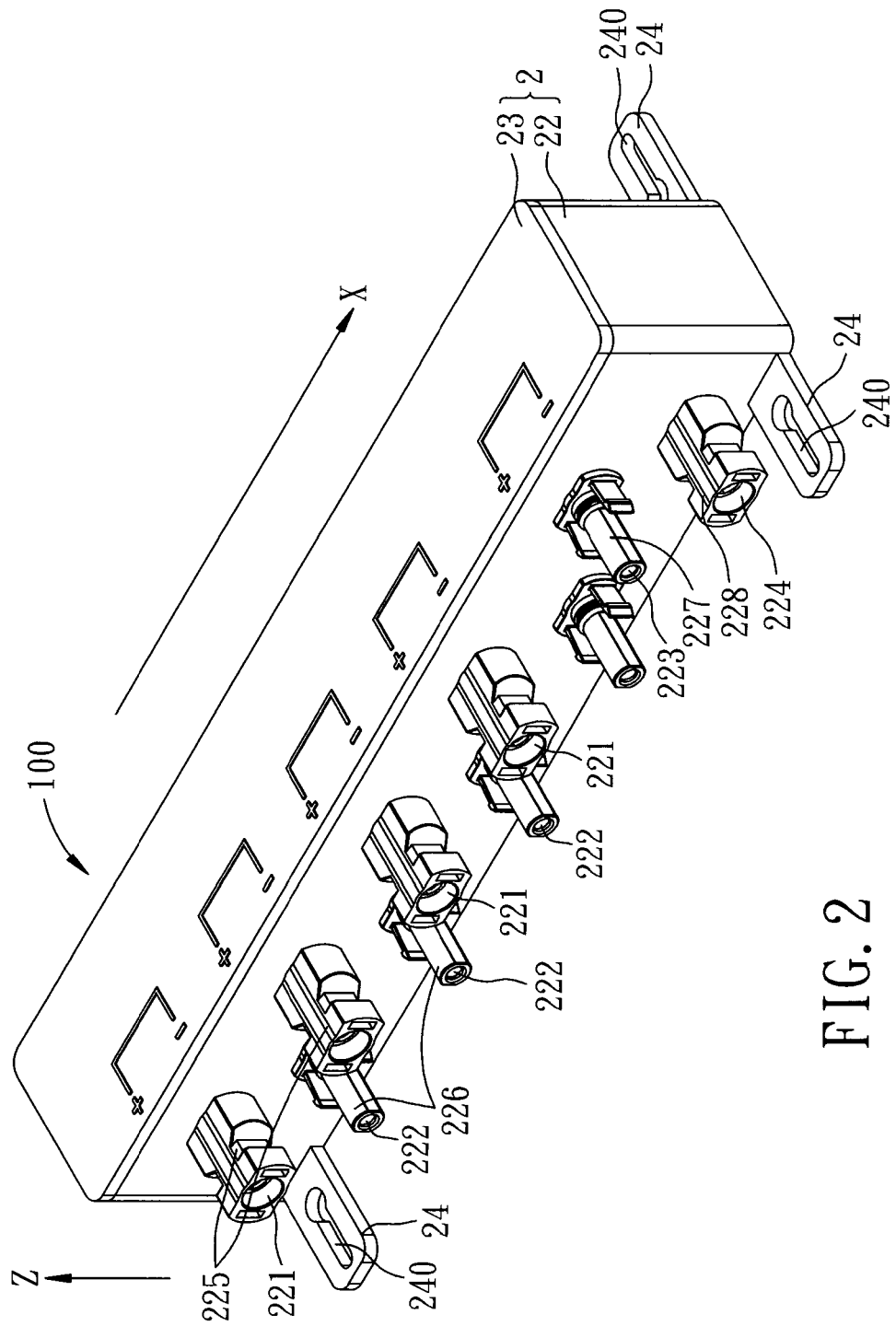
FIG. 2 is a perspective view illustrating a first preferred embodiment of a combiner box of the present invention.
Figure 3:
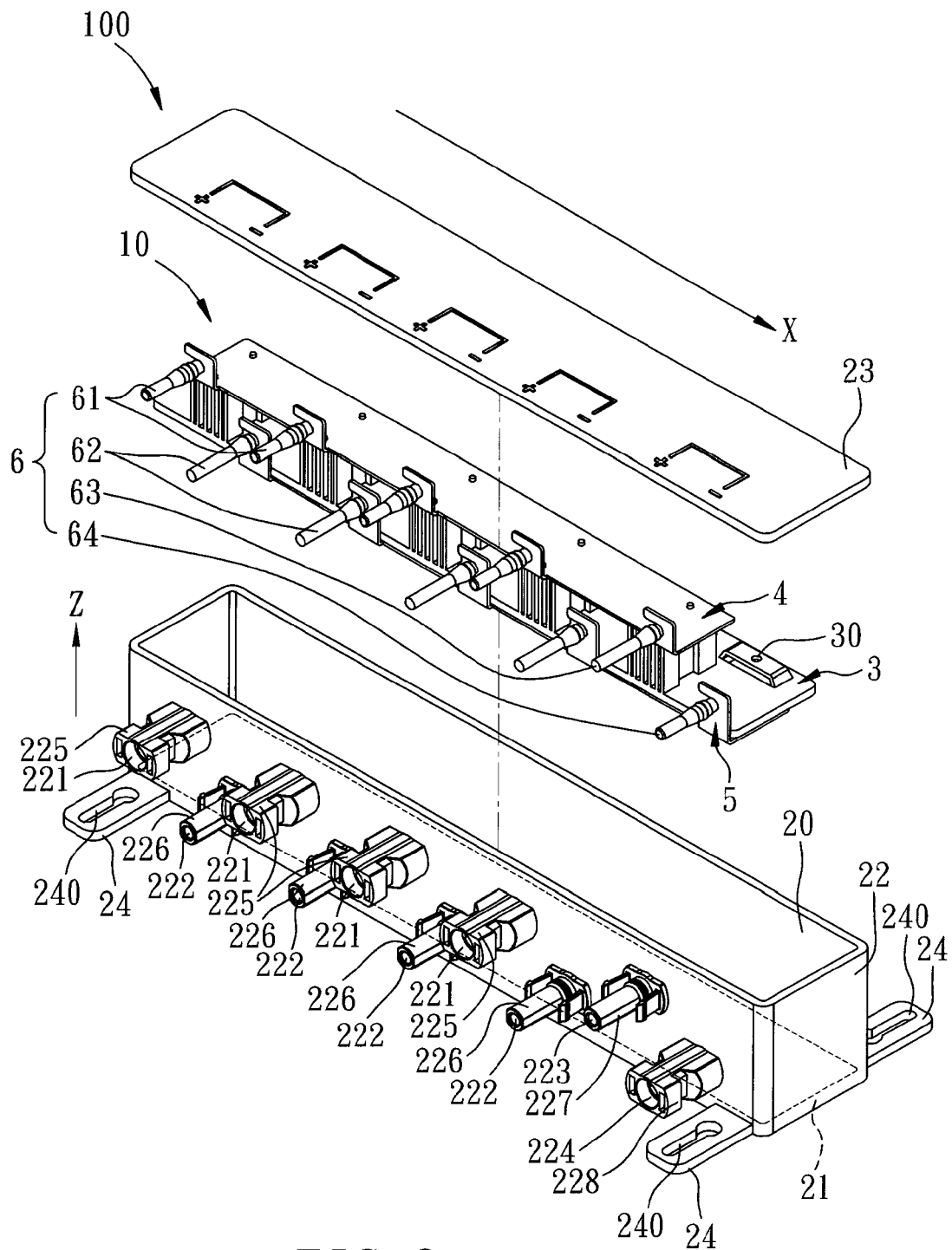
FIG. 3 is an exploded view illustrating components of the combiner box of the first preferred embodiment.
Figure 4:
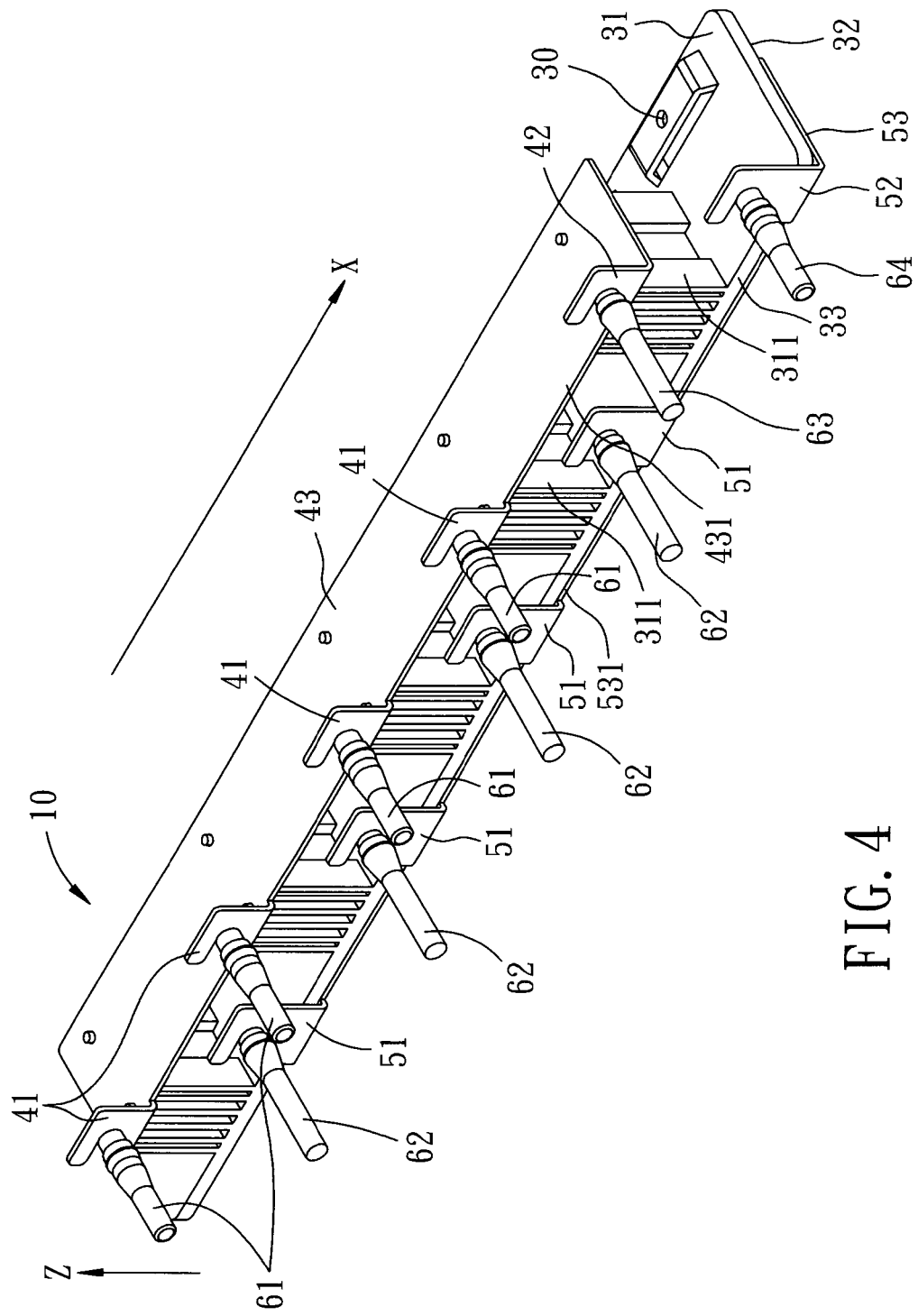
FIG. 4 is a perspective view illustrating a combiner module of the combiner box of the first preferred embodiment.
Figure 5:
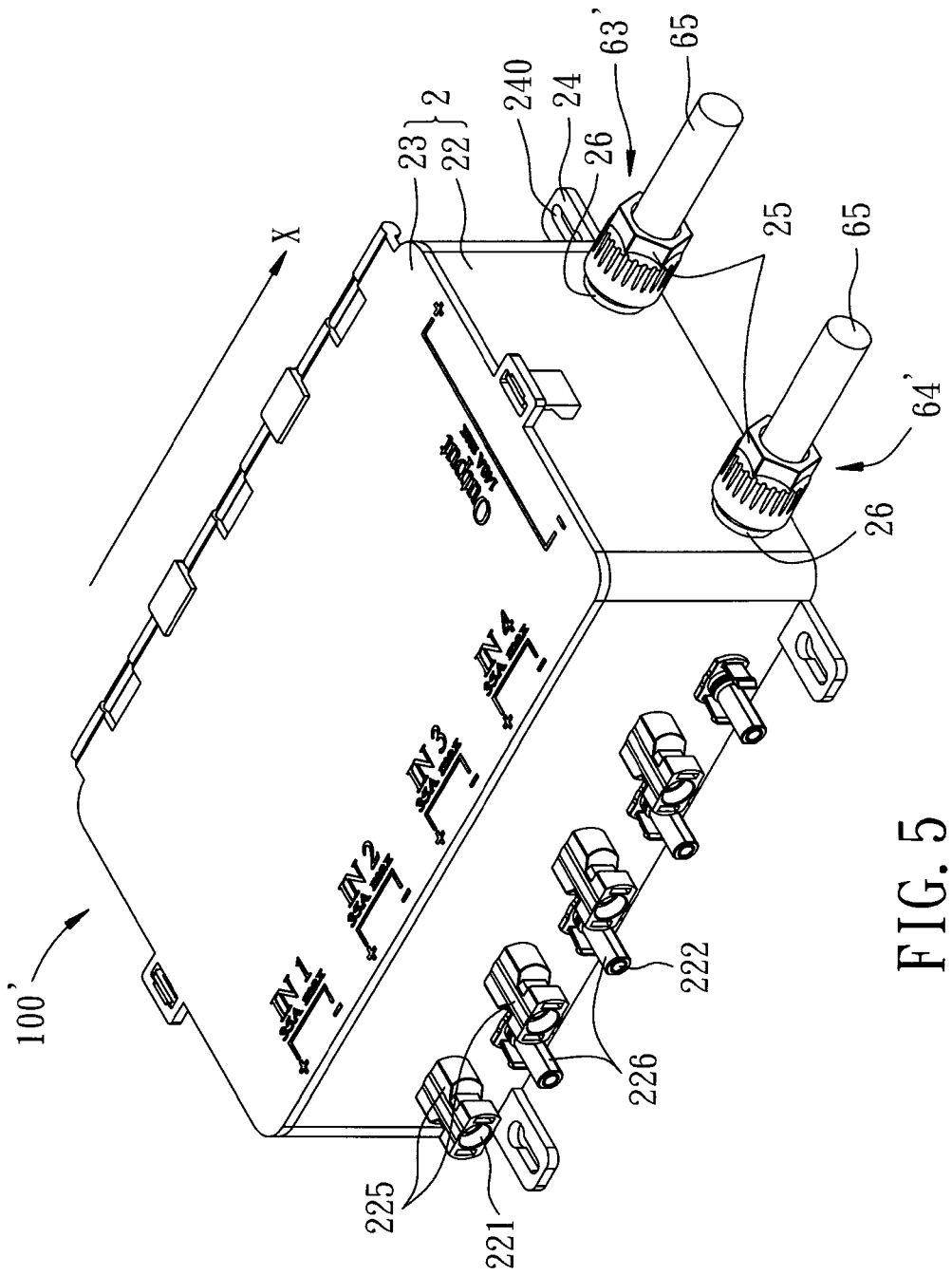
FIG. 5 is a perspective view illustrating a second preferred embodiment of a combiner box of the present invention.

Referring to FIGS. 2 to 4, a first preferred embodiment of a combiner box 100 of this invention includes a casing 2, a combiner module 10 disposed in the casing 2, and an electrical connector unit 6.

In this embodiment, the casing 2 is in a rectangular shape, and includes a bottom wall 21, a surrounding wall 22, a cover plate 23, and a plurality of mounting plates 24. The bottom wall 21 and the surrounding wall 22 cooperatively define an accommodating space 20, and the cover 23 removably covers on the surrounding wall 22 to close the accommodating space 20. For the purpose of convenience of illustration, a direction parallel to one side of the surrounding wall 22 (e.g., a lengthwise side) is defined as a first direction (X), and a direction perpendicular to the bottom wall 21 (i.e., a height direction) is defined as a second direction (Z).

The surrounding wall 22 is formed with a plurality of first input sockets 221, a plurality of second input sockets 222, a first output socket 223 and a second output socket 224. The first and second input sockets 221, 222 are spaced apart from each other and are arranged along the first direction (X). In particular, the second input sockets 222 are disposed at a level between the first input sockets 221 and the bottom wall 21, and are alternatingly arranged with the first input sockets 221 along the first direction (X). The second output socket 224 is disposed below the first output socket 223, and is misaligned from the first output socket 223 along the second direction (Z). The mounting plates 24 project parallelly from the bottom wall 21, and are formed with respective mounting holes 240. The combiner box 100 can be secured to a peripheral wall (not shown) using fasteners (e.g., nails, screws, and the like) extending respectively through the mounting holes 240.

The combiner module 10 is disposed in the accommodating space 20 of the casing 2, and includes an electrically insulating board 3, a first electrode set 4 and a second electrode set 5.

Referring to FIG. 4, the electrically insulating board 3 has a first surface 31, a second surface 32 opposite to the first surface 31, and a first side 33 connected between the first and second surfaces 31, 32 and extending along the first direction (X). The electrically insulating board 3 includes a plurality of insulating blocks 311 disposed on the first surface 31 at spaced-apart positions, projecting in the second direction (Z) away from the first surface 31, and arranged adjacent to the first side 33 of the electrically insulating board 3 along the first direction (X). Further, the electrically insulating board 3 is formed with a plurality of through holes 30 (only one is visible due to the viewing angle), and the electrically insulating board 3 can be secured to the bottom wall 21 of the casing 2, for example, using screws extending through the through holes 30.

The first electrode set 4 is disposed over the first surface 31 of the electrically insulating board 3, and includes a plurality of first input electrodes 41, a first output electrode 42 electrically connected to the first input electrodes 41, and an elongated first conductive plate 43. The first input electrodes 41 are spaced apart from each other and are arranged along the first direction (X). The first input electrodes 41 and the first output electrode 42 correspond to the first input sockets 221 and the first output socket 223 of the surrounding wall 22, respectively.

In this embodiment, the first conductive plate 43 is mounted on the insulating blocks 311 along the first direction (X), and is integrally formed with the first input and output electrodes 41, 42 to establish electrical connection among the first input and output electrodes 41, 42. In particular, the first conductive plate 43 has a longitudinal side 431 adjacent to the first side 33 of the electrically insulating board 3, and the first input and output electrodes 41, 42 project from the longitudinal side 431 at positions corresponding respectively to the spaced-apart positions of the insulating blocks 311 in the second direction (Z) away from the first surface 31 of the electrically insulating board 3.

The second electrode set 5 is disposed on the second surface 32 of the electrically insulating board 3, and includes a plurality of second input electrodes 51, a second output electrode 52 electrically connected to the second input electrodes 51, and an elongated second conductive plate 53. The second input electrodes 51 are spaced apart from each other, are arranged along the first direction (X), and partially cover the first side 33 of the electrically insulating board 3. The second input electrodes 51 and the second output electrode 52 are disposed below the first input electrodes 41 and the first output electrode 42 with respect to the electrically insulating board 3, and correspond to the second input sockets 222 and the second output socket 224, respectively.

In this embodiment, the second conductive plate 53 is mounted on the second surface 32 of the electrically insulating board 3 along the first direction (X). The second input electrodes 51 and the second output electrode 52 are integrally formed with the second conductive plate 53 such that the second input electrodes 51 are electrically connected to the second output electrode 52. In particular, the second conductive plate 53 has a longitudinal side 531 adjacent to the first side 33 of the electrically insulating board 3, and the second input electrodes 51 and the second output electrode 52 project from the longitudinal side 531 in the second direction (Z) toward the first surface 31 of the electrically insulating board 3.

The electrical connector unit 6 includes a plurality of first input terminals 61, a plurality of second input terminals 62, a first output component 63 and a second output component 64. The first input terminals 61 are disposed in the first input sockets 221, and are electrically connected to and substantially perpendicular to the first input electrodes 41 of the first electrode set 4, respectively. The second input terminals 62 are disposed in the second input sockets 222, and are electrically connected to and substantially perpendicular to the second input electrodes 51 of the second electrode set 5, respectively. The first and second output components 63, 64 correspond to and are registered with the first and second output sockets 223, 224, and are electrically connected to the first and second output electrodes 42, 52, respectively. In this embodiment, each of the first and second output components 63, 64 is an output terminal electrically connected to and substantially perpendicular to a respective one of the first and second output electrodes 42, 52.

In this embodiment, the casing 2 further includes a plurality of first input-connector jacks 225, a plurality of second input-connector jacks 226, a first output-connector jack 227 and a second output-connector jack 228 that are substantially perpendicular to and project from the surrounding wall 22 of the casing 2 outside of the accommodating space 20. The first input-connector jacks 225 are registered and in spatial communication with the first input sockets 221 of the surrounding wall 22 to receive the first input terminals 61 therein, respectively. The second input-connector jacks 226 are registered and in spatial communication with the second input sockets 222 of the surrounding wall 22 to receive the second input terminals 62 therein, respectively. The first and second output-connector jacks 227, 228 are registered and in spatial communication with the first and second output sockets 223, 224 of the surrounding wall 22 to receive the output terminals of the first and second output components 63, 64 therein, respectively. In practice, the casing 2 can be formed by injection molding. Since the feature of this invention does not reside in the method for manufacturing the casing 2, details thereof will be omitted herein for the sake of brevity.

For example, the first input terminals 61 of the electrical connector unit 6 are configured to be electrically connected to respective positive output ends of a power source, such as a solar energy converter (not shown), and the first output component (terminal) 63 of the electrical connector unit 6 is configured to be electrically connected to a positive input end of a back-end apparatus, such as a charge controller and an inverter (not shown). Accordingly, the second input terminals 62 of the electrical connector unit 6 are configured to be electrically connected to respective negative output ends of the power source, and the second output component (terminal) 64 of the electrical connector unit 6 is configured to be electrically connected to a negative input end of the back-end apparatus. In particular, the first input-connector jacks 225 are male connectors matching with female connectors of the power source, and the second output-connector jack 228 is also a male connector matching with a female connector of the back-end apparatus. The second input-connector jacks 226 are female connectors matching with male connectors of the power source, and the first output-connector jack 227 is also a female connector matching with a male connector of the back-end apparatus. Therefore, the first input terminals 61 and the second output component 64 are male connecting terminals, and the second input terminals 62 and the first output component 63 are female connecting terminals. It should be noted that the feature of this invention does not reside in the usage of specific male and female connectors and specific male and female connecting terminals, which may be readily appreciated by those skilled in the art, and the scope of this invention is not limited to the disclosure of this embodiment.

Referring to FIGS. 5 to 8, a second preferred embodiment of a combiner box 100' of this invention is shown to be similar to the first preferred embodiment. In the second preferred embodiment, configurations of the casing 2, the combiner module 10' and the first and second output components 63', 64' are different from those of the combiner box 100 of the first preferred embodiment.

In this embodiment, the electrically insulating board 3 of the combiner module 10' further has a second side 34 and a third side 35 that are connected between the first and second surfaces 31, 32. In particular, the second side 34 is opposite and parallel to the first side 33, and the third side 35 is perpendicular to the first and second sides 33, 34.

The first electrode set 4 of the combiner module 10' further includes a plurality of conductive frames 44 and a plurality of conducting wire components 45. Unlike the first preferred embodiment, the first conductive plate 43 is mounted on the first surface 31 of the electrically insulating board 2 at the second side 34, extends along the first direction (X), and has one end 432 adjacent to the third side 35. In this embodiment, the first output electrode 42 of the first electrode set 4 is integrally formed with the first conductive plate 43, projects upwardly from said one end 432 of the first conductive plate 43 with respect to the first surface 31 (i.e., along the second direction (Z)), and is bent toward the first direction (X).

The conductive frames 44 of the first electrode set 4 are electrically connected to and mounted on the first conductive plate 43, and are arranged along the first direction (X) at positions corresponding to the spaced-apart positions of the insulating blocks 311, respectively. In particular, a height of each of the conductive frames 44 in the second direction (Z) is substantially equal to a height of each of the insulating blocks 311 in the same direction. The first input electrodes 41 of the first electrode set 4 are mounted on the insulating blocks 311, respectively. Each of the conducting wire components 45 electrically connects a respective one of the first input electrodes 41 to a corresponding one of the conductive frames 44 with a least distance therebetween, so as to electrically connect the first input electrodes 41 to the first output electrode 42.

The second conductive plate 53 of the second electrode set 5 is similar to that of the first preferred embodiment, and has one end 532 adjacent to the third side 35 of the electrically insulating board 3. In this embodiment, the second output electrode 52 is integrally formed with the second conductive plate 53, projects upwardly from said one end 532 of the second conductive plate 53 with respect to the first surface 31 (i.e., along the second direction (Z)), and is bent toward the first direction (X).

In this embodiment, each of the first and second output components 63', 64' of the electrical connector unit 6 is a connector allowing a cable 65 having a core 651 to be inserted therethrough, so that the core 651 is electrically connected to a respective one of the first and second output electrodes 42, 52. The connector of each of the first and second output components 63' and 64' includes a union nut 26 and a waterproof nut 25. The union nut 26 is substantially perpendicular to and projects from the surrounding wall 22 outside of the accommodating space 20, and is registered and in spatial communication with a respective one of the first and second output sockets 223 and 224 of the surrounding wall 22 to allow insertion of the cable 65. The waterproof nut 25 is fittingly sleeved around the union nut 26 for securing the cable 65 received in the union nut 26.

It should be appreciated that the waterproof nut 25 is used for preventing moisture and rainwater, which may damage the combiner module 10' received in the accommodating space 20, from permeating into the accommodating space 20 through the first and second output sockets 223 and 224. Further, the casing 2 may additionally include a waterproof ring 260 surrounding a periphery of the cover plate 23 for enhancing the moisture-proofing effect. For example, the waterproof ring 260 may be made of silicone.

Figure 8:
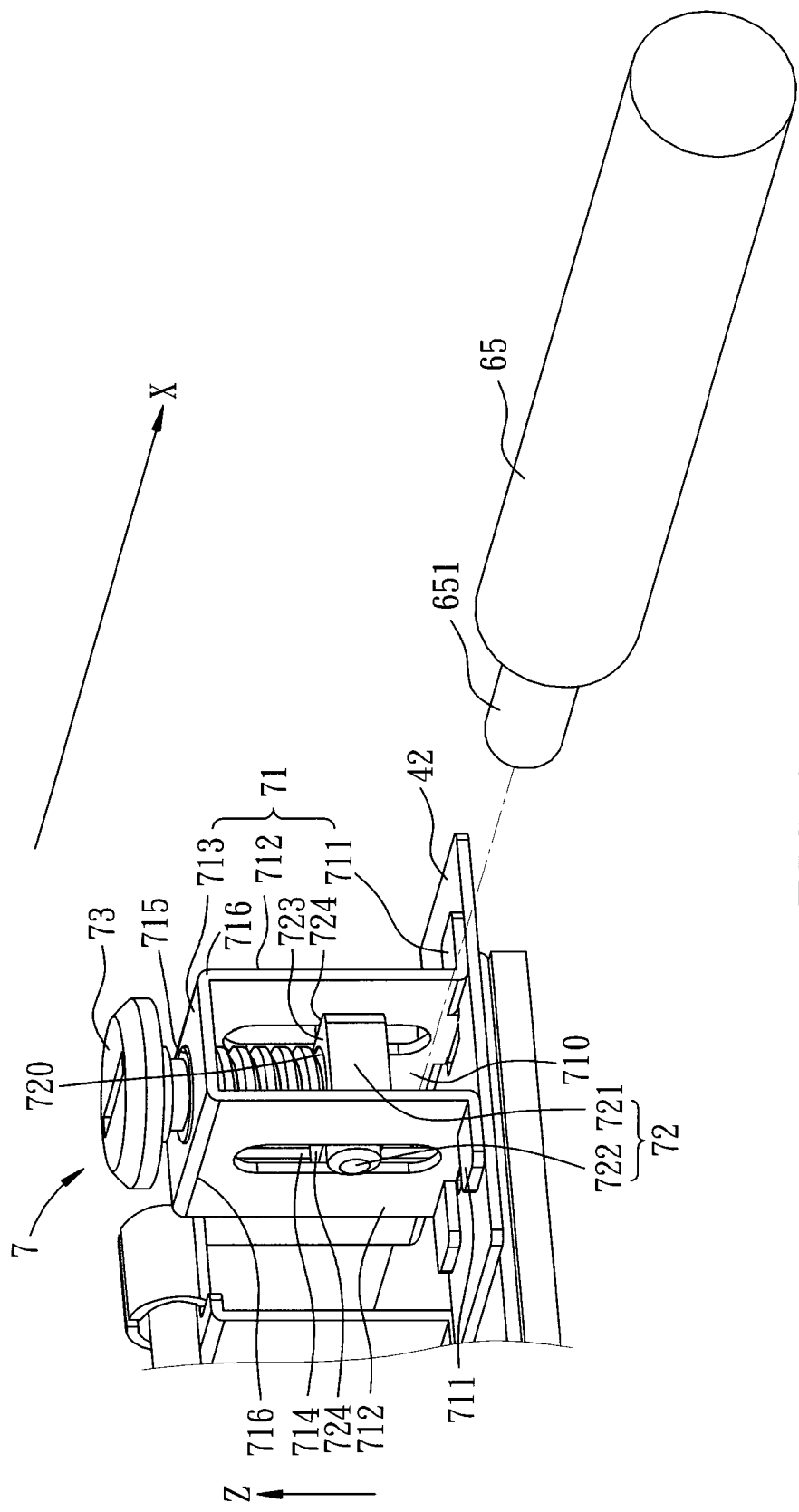
FIG. 8 is a partially enlarged view of FIG. 7 to illustrate a clamping unit of the combiner module of the second preferred embodiment for clamping a cable.

In this embodiment, the combiner module 10' further includes a pair of clamping units 7 for clamping and securing the cables 65 to the first and second output electrodes 42 and 52, respectively. In particular, as best shown in FIG. 8, each of the clamping units 7 includes a fixed frame 71, a slidable block 72 and a bolt 73.

The fixed frame 71 has four base plates 711 (only three are visible due to the viewing angle) mounted on a corresponding one of the first and second output electrodes 42 and 52, a pair of vertical plates 712 each of which is connected perpendicularly to a corresponding pair of the base plates 711, and a top plate 713 connected to the vertical plates 712 and formed with a through hole 715. The vertical plates 712 and the top plate 713 cooperatively define a clamping space 710 for receiving the core 651 of the cable 65. In particular, each of the vertical plates 712 extends from the corresponding pair of the base plates 711, which are registered with each other along the first direction (X), along the second direction (Z) and has a top edge 716, and the top plate 713 is connected to the top edges 716 of the vertical plates 712. Further, each of the vertical plates 712 is formed with a slot 714 extending along the second direction (Z). The slots 714 of the vertical plates 712 and the through hole 715 of the top plate 713 are in spatial communication with the clamping space 710.

The slidable block 72 includes a block body 721 and a pair of slide rods 722. The block body 721 is fittingly disposed in the clamping space 710, and has a top surface 723 facing the top plate 713 and being formed with a threaded hole 720, and a pair of side surfaces 724 facing the vertical plates 712, respectively. The slide rods 722 project from the side surfaces 724 of the block body 721 and extend slidably into the slots 714 of the vertical plates 712, respectively. The bolt 73 extends through the through hole 715 in the top plate 713 and is screwed into the threaded hole 720 in the block body 721 of the slidable block 72 for moving the slidable block 72 upwardly and downwardly (i.e., in the second direction (Z)) in the clamping space 710 with respect to the corresponding one of the first and second output electrodes 42 and 52. Thus, the slidable block 72 is urged to press and secure the core 651 of the cable 65 abutting against the corresponding one of the first and second output electrodes 42 and 52.

Figure 6:
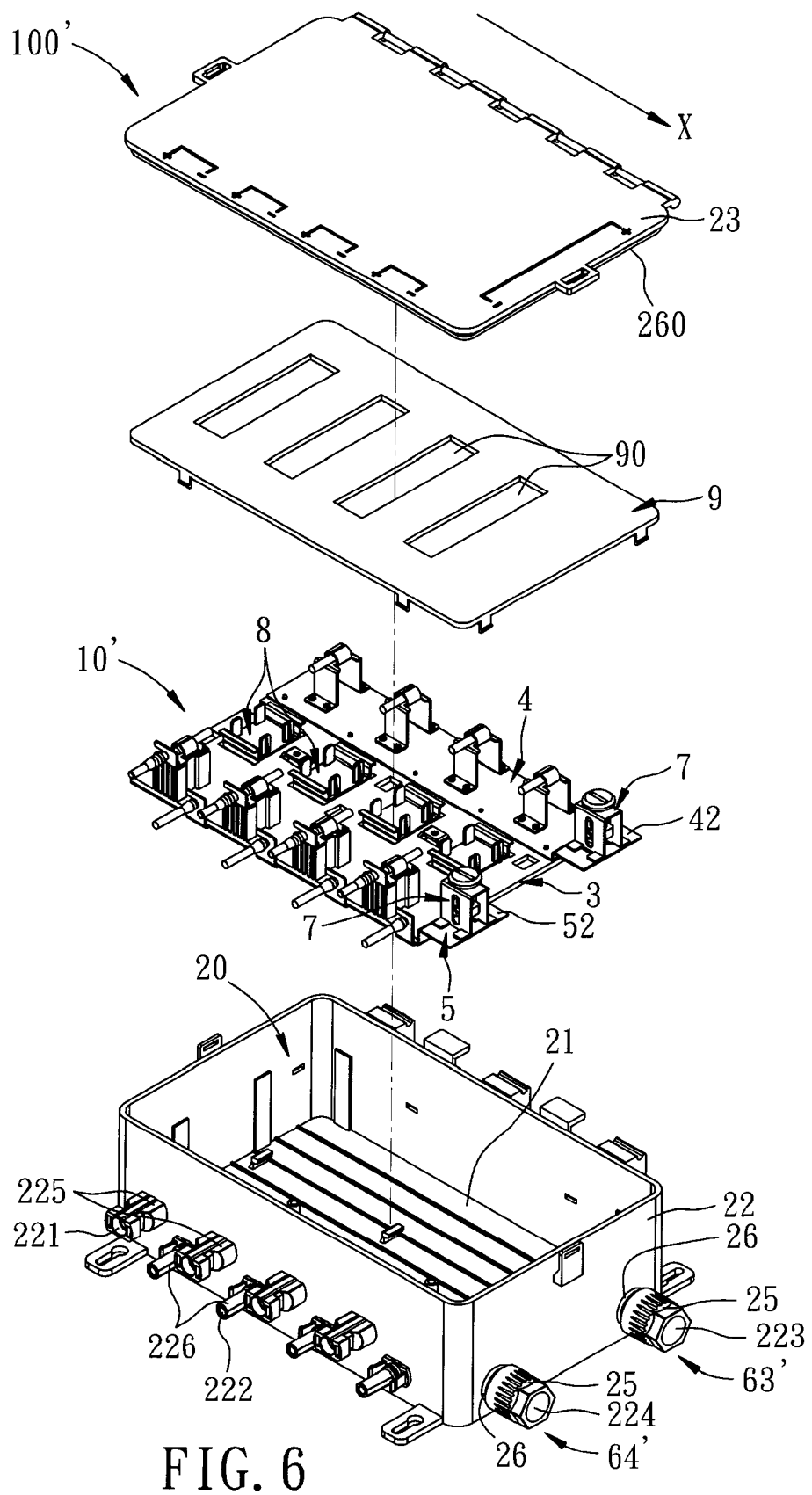
FIG. 6 is an exploded view illustrating components of the combiner box of the second preferred embodiment.
Figure 7:
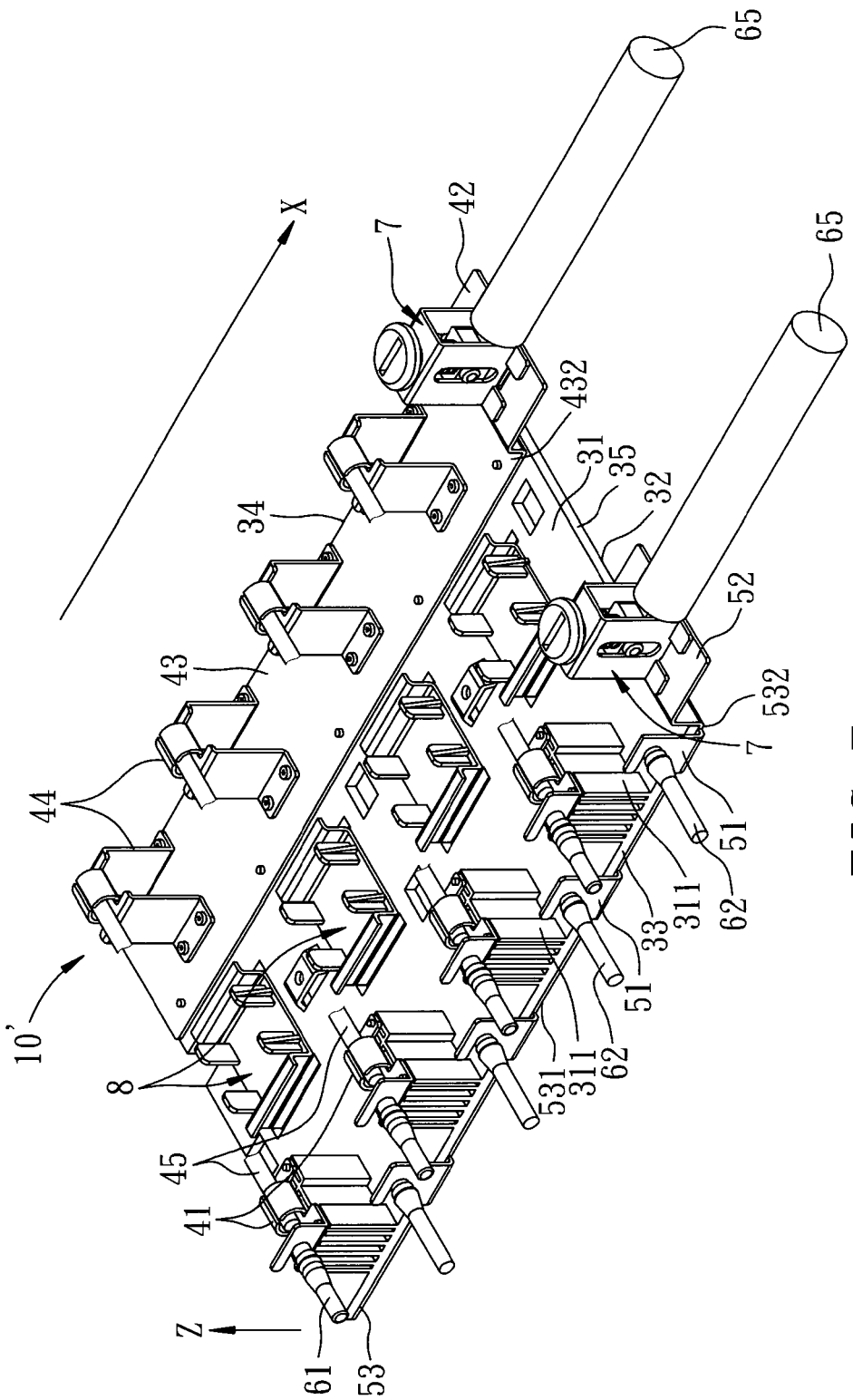
FIG. 7 is a perspective view illustrating a combiner module of the combiner box of the second preferred embodiment.
Figure 9:
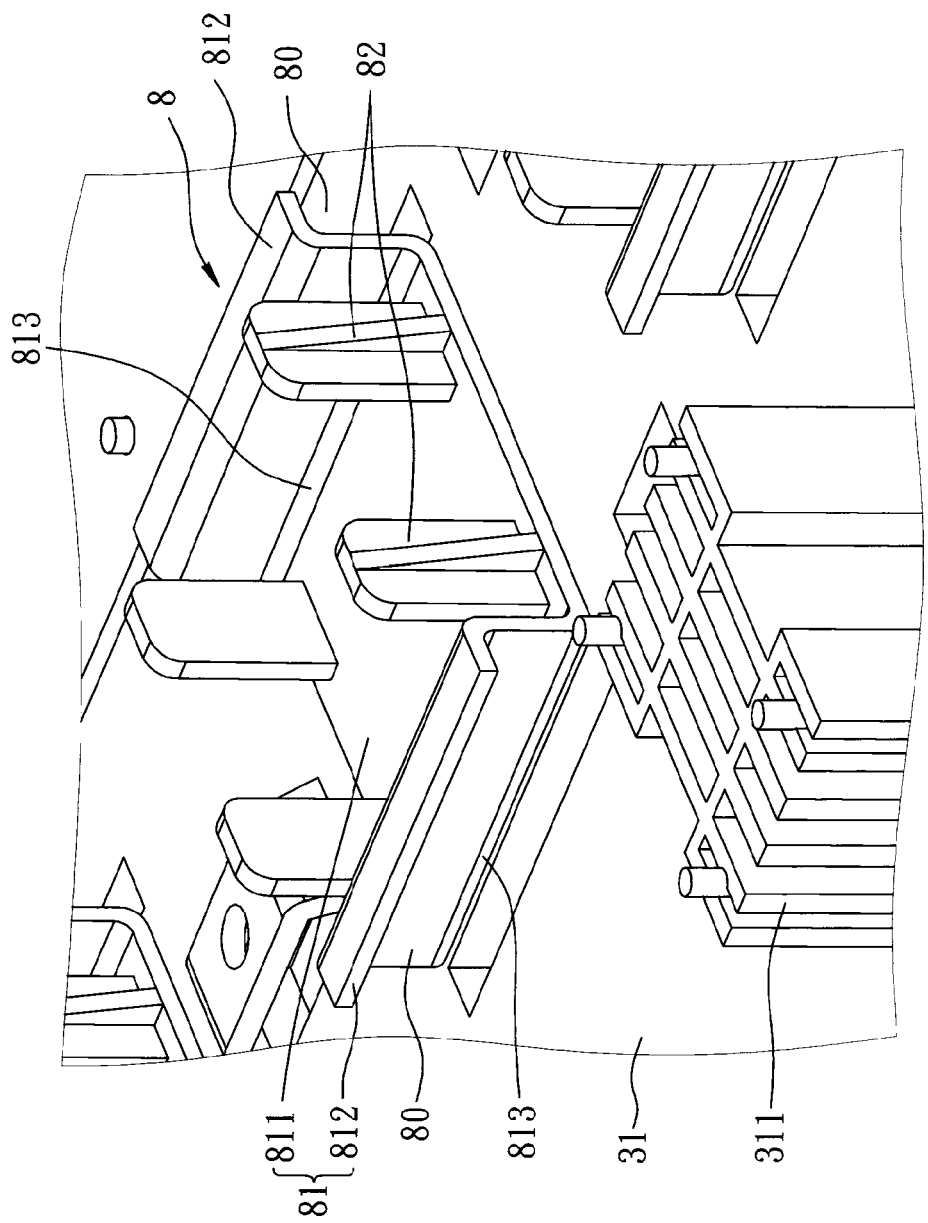
FIG. 9 is a partially enlarged view of FIG. 7 to illustrate a mounting frame of the combiner module of the second preferred embodiment.
Figure 11:
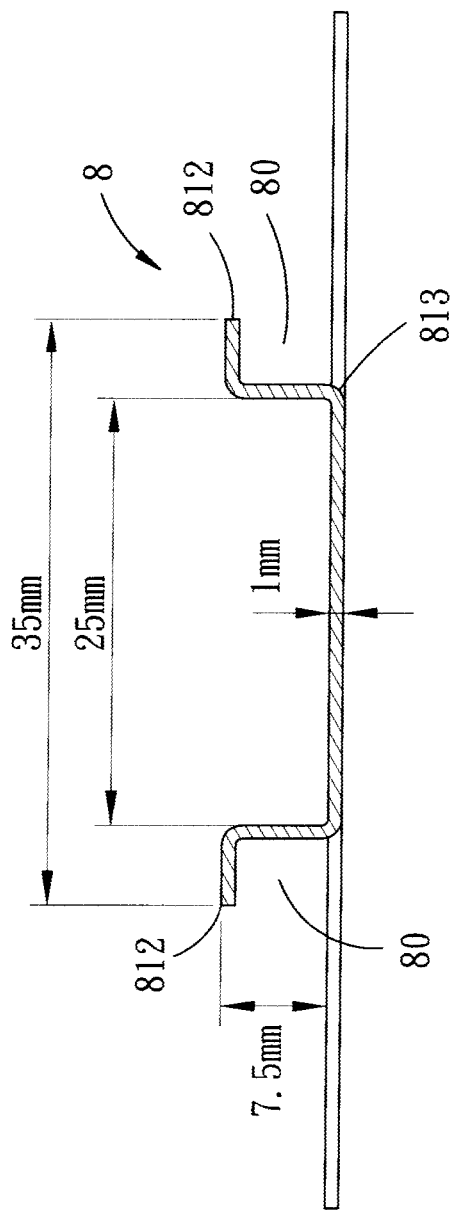
FIG. 11 is a cross-sectional view of the mounting frame for illustrating dimensions thereof.

Referring to FIGS. 6, 7 and 9, the combiner module 10' of this embodiment further includes a plurality of mounting frames 8 disposed on a middle portion of the first surface 31 of the electrically insulating board 3 between the first and second sides 33 and 34 and arranged along the first direction (X). For example, the mounting frames 8 may be integrally formed with the electrically insulating board 3. Each of the mounting frames 8 includes a base 81 and a plurality of positioning plates 82. The base 81 of each of the mounting frames 8 includes a base part 811 disposed on the first surface 31 and having two opposite edges 813 parallel to the first direction (X), and a pair of protrusion parts 812 projecting respectively from the edges 813 in the second direction (Z) away from the first surface 31 and bent toward opposite directions parallel to the first surface 31. The positioning plates 82 project from the base part 811 in the second direction (Z) away from the first surface 31. Each of the protrusion parts 812 cooperates with the first surface 31 to form a groove 80 therebetween. In this embodiment, each of the mounting frames 8 has a dimension of 35 mm from a distal end of one of the protrusion parts 812 to a distal end of the other one of the protrusion parts 812 (see FIG. 11).

The combiner box 100' of this embodiment further includes a partition plate 9 disposed in the accommodating space 20 in the casing 2 over the combiner module 10', engaged with the surrounding wall 22, and formed with a plurality of openings 90. In particular, the mounting frames 8 are registered with the openings 90 in the partition plate 9, respectively.

Figure 10:
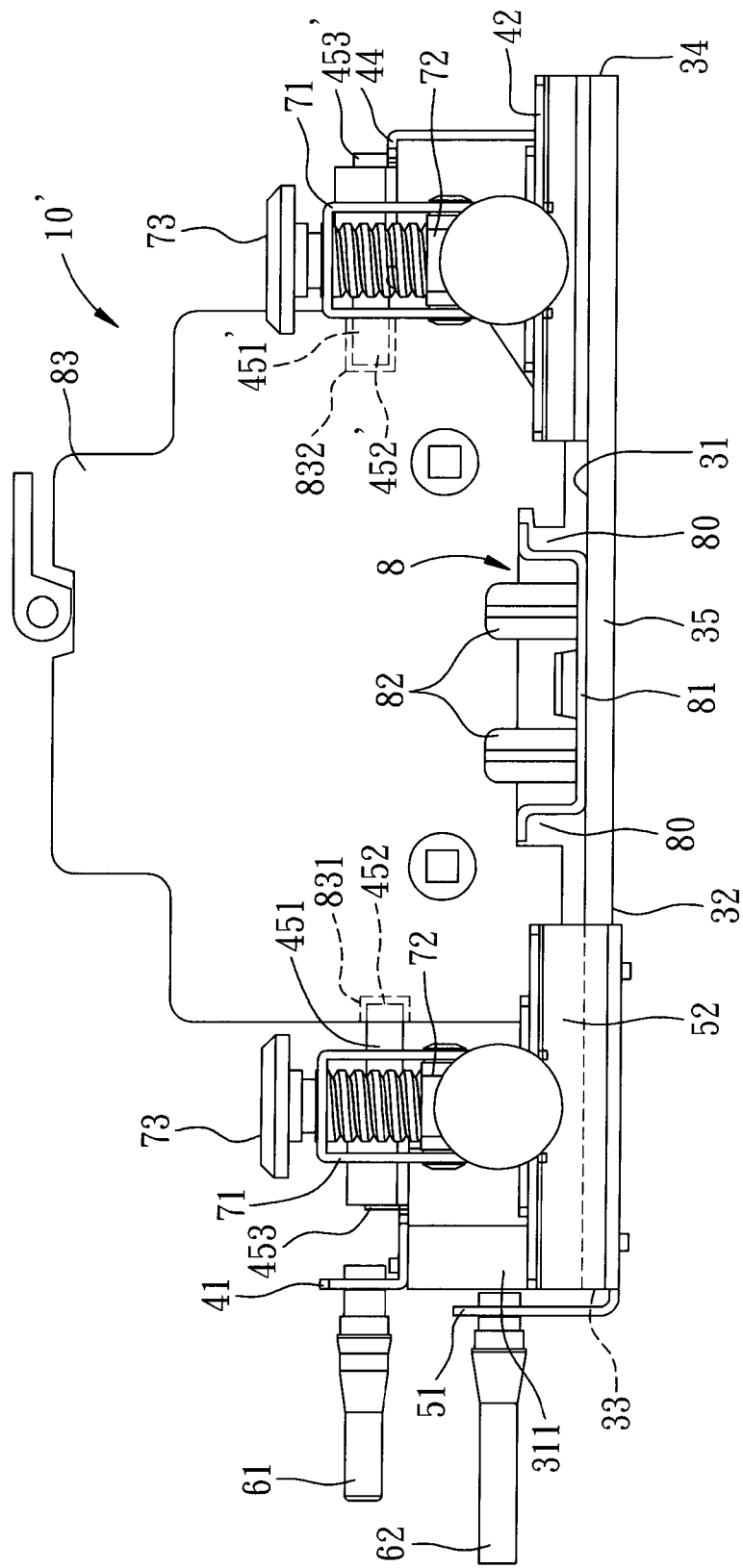
FIG. 10 is a schematic side view illustrating an example of the combiner module of the second preferred embodiment provided with a circuit protection device.

FIG. 10 illustrates an example of the combiner box 100' of the second preferred embodiment provided with a plurality of circuit protection devices 83 (only one is visible due to the viewing angle), such as a fuse, a surge protector, etc. For example, the circuit protection devices 83 are used for stabilizing current inputs from the power source and current outputs to the back-end apparatus. Each of the circuit protection devices 83 is mounted on one of mounting frames 8 and is engaged with the grooves 80 of the respective mounting frame 8, and is prevented from moving along the first direction (X) by the positioning plates 82 of the respective mounting frame 8. In particular, each of the circuit protection devices 83 includes a first wire receiver 831 adjacent to a respective one of the first input electrodes 41 and a second wire receiver 832 adjacent to a corresponding one of the conductive frames 44.

In this example, each of the conducting wire components 45 of the first electrode set 4 includes a pair of wires 451 and 451'. One of the wires 451 has one end 453 electrically connected to the respective first input electrode 41 and the other end 452 inserted into and electrically connected to the first wire receiver 831 of one of the circuit protection devices 83. The other one of the wires 451' has one end 453' electrically connected to the corresponding conductive frame 44 and the other end 452' inserted into and electrically connected to the second wire receiver 832 of said one of the circuit protection devices 83. The wires 451 and 451' of each of the conducting wire components 45 are electrically connected to each other through a respective one of the circuit protection devices 83. When the circuit protection devices 83 are installed on the combiner module 10' of the combiner box 100', the circuit protection devices 83 are exposed from the partition plate 9 through the openings 90, respectively. As a result, the mounting frames 8 and the openings 90 of the partition plate 9 facilitate assembly/disassembly of the circuit protection devices 83.

In this embodiment, the first and second input sockets 221, 222, the first and second input terminals 61, 62 and the first and second input-connector jacks 225, 226 are similar to those of the first preferred embodiment.

To sum up, with the staggered arrangement of the first and second input sockets 221, 222, it is relatively easier to design the molds used for forming the first and second input-connector jacks 225 and 226 and the first and second output-connector jacks 227 and 228 via injection molding. Further, the pre-assembled combiner module 10, 10' facilitates installation process of the combiner box 100, 100' so as to reduce a risk of human error, installation time, and labor-related costs. Also, a manufacturing cost of the combiner box 100, 100' is reduced since the combiner module 10, 10' does not utilize terminal blocks found in a conventional combiner box.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A combiner box, comprising:
   a casing including a bottom wall and a surrounding wall that cooperatively define an accommodating space, said surrounding wall being formed with a plurality of first input sockets, a plurality of second input sockets, a first output socket and a second output socket, said first and second input sockets being spaced apart from each other and being arranged along a first direction parallel to said surrounding wall, said second input sockets being disposed at a level between said first input sockets and said bottom wall and being alternatingly arranged with said first input sockets along the first direction;

a combiner module disposed in said accommodating space of said casing over said bottom wall, and including an electrically insulating board having a first surface, a second surface opposite to said first surface, and a first side connected between said first and second surfaces and extending along the first direction, a first electrode set disposed over said first surface of said electrically insulating board, and including a plurality of first input electrodes that are spaced apart from each other, that are arranged along the first direction and that correspond respectively to said first input sockets of said surrounding wall, and a first output electrode that is electrically connected to said first input electrodes and that corresponds to said first output socket of said surrounding wall, and a second electrode set disposed on said second surface of said electrically insulating board, and including a plurality of second input electrodes that are spaced apart from each other, that are arranged along and partially cover said first side of said electrically insulating board, that are disposed below said first input electrodes with respect to said electrically insulating board, and that correspond respectively to said second input sockets of said surrounding wall, and a second output electrode that is electrically connected to said second input electrodes and that corresponds to said second output socket of said surrounding wall; and an electrical connector unit including a plurality of first input terminals disposed in said first input sockets and electrically connected to said first input electrodes, respectively, a plurality of second input terminals disposed in said second input sockets and electrically connected to said second input electrodes, respectively, a first output component corresponding to said first output socket and electrically connected to said first output electrode, and a second output component corresponding to said second output socket and electrically connected to said second output electrode.

2. The combiner box as claimed in claim 1, wherein said electrically insulating board includes a plurality of insulating blocks that are disposed on said first surface at spaced-apart positions corresponding respectively to said first input electrodes of said first electrode set, that project in a second direction perpendicular to said bottom wall away from said first surface, and that are arranged at said first side of said electrically insulating board along the first direction, said first electrode set being disposed on said insulating blocks.

3. The combiner box as claimed in claim 2, wherein:

said first electrode set further includes an elongated first conductive plate that is mounted on said insulating blocks along the first direction, that has a longitudinal side adjacent to said first side, and that is integrally formed with said first output and input electrodes to establish electrical connection among said first output and input electrodes, said first input and output electrodes projecting from said longitudinal side of said first conductive plate in the second direction away from said first surface of said electrically insulating board; and said second electrode set further includes an elongated second conductive plate that is mounted on said second surface of said electrically insulating board along the first direction, that has a longitudinal side adjacent to said first side, and that is integrally formed with said second output and input electrodes to establish electrical connection among said second output and input electrodes, said second input and output electrodes projecting from said longitudinal side of said second conductive plate in the second direction toward said first surface of said electrically insulating board.

4. The combiner box as claimed in claim 2, wherein:

said electrically insulating board further has a second side connected between said first and second surfaces and opposite and parallel to said first side, and a third side connected between said first and second surfaces and perpendicular to said first and second sides;

said first electrode set further includes:

an elongated first conductive plate that is mounted on said first surface of said electrically insulating board at said second side along the first direction and that has one end adjacent to said third side, said first output electrode of said first electrode set being integrally formed with said first conductive plate, projecting upwardly from said one end of said first conductive plate with respect to said first surface, and being bent toward the first direction, a plurality of conductive frames that are electrically connected to and mounted on said first conductive plate along the first direction at positions corresponding respectively to the spaced-apart positions of said insulating blocks, said first input electrodes of said first electrode set being mounted respectively on said insulating blocks, and a plurality of conducting wire components each of which electrically connects a respective one of said first input electrodes to a corresponding one of said conductive frames so as to electrically connect said first input electrodes to said first output electrode; and said second electrode set further includes an elongated second conductive plate that is mounted on said second surface of said electrically insulating board along the first direction, that is integrally formed with said second output and input electrodes to establish electrical connection among said second output and input electrodes, and that has one end adjacent to said third side, said second input electrodes projecting from a longitudinal side of said second conductive plate that is adjacent to said first side toward said first surface of said electrically insulating board, said second output electrode being integrally formed with said second conductive plate, projecting upwardly from said one end of said second conductive plate with respect to said first surface, and being bent toward the first direction.

5. The combiner box as claimed in claim 4, further comprising a partition plate disposed in said accommodating space in said casing over said combiner module, engaged with said surrounding wall, and formed with a plurality of openings;

wherein said combiner module further includes a plurality of mounting frames integrally formed with said electrically insulating board, disposed on a middle portion of said first surface of said electrically insulating board between said first and second sides, registered respectively with said openings in said partition plate, and arranged along the first direction, each of said mounting frames including a base including a base part disposed on said first surface and having two opposite edges parallel to the first direction, and a pair of protrusion parts projecting respectively from said edges in the second direction away from said first surface and being bent toward opposite directions parallel to said first surface, each of said protrusion parts cooperating with said first surface to form a groove therebetween, and a plurality of positioning plates projecting from said base part in the second direction away from said first surface.

6. The combiner box as claimed in claim 5, further comprising a plurality of circuit protection devices each of which is mounted on a respective one of said mounting frames and is engaged with said grooves of said respective one of said mounting frames, each of which is prevented from moving along the first direction by said positioning plates of said respective one of said mounting frames, and each of which includes a first wire receiver adjacent to a respective one of said first input electrodes and a second wire receiver adjacent to a corresponding one of said conductive frames, wherein each of said conducting wire components of said first electrode set includes a pair of wires, one of said wires having one end electrically connected to said respective one of said first input electrodes and the other end inserted into and electrically connected to said first wire receiver of one of said circuit protection devices, the other one of said wires having one end electrically connected to said corresponding one of said conductive frames and the other end inserted into and electrically connected to said second wire receiver of said one of said circuit protection devices, said wires of each of said conducting wire components being electrically connected to each other through a respective one of said circuit protection devices.

7. The combiner box as claimed in claim 1, wherein each of said first and second output components of said electrical connector unit is an output terminal electrically connected to and substantially perpendicular to a respective one of said first and second output electrodes, said first input terminals are substantially perpendicular to said first input electrodes of said first electrode set, respectively, and said second input terminals are substantially perpendicular to said second input electrodes of said second electrode set, respectively.

8. The combiner box as claimed in claim 7, wherein said casing further includes:

a plurality of first input-connector jacks that are substantially perpendicular to and project from said surrounding wall outside of said accommodating space, and that are registered with and in spatial communication with said first input sockets of said surrounding wall to receive said first input terminals therein, respectively;

a plurality of second input-connector jacks that are substantially perpendicular to and project from said surrounding wall outside of said accommodating space, and that are registered with and in spatial communication with said second input sockets of said surrounding wall to receive said second input terminals therein, respectively; and first and second output-connector jacks that are substantially perpendicular to and project from said surrounding wall outside of said accommodating space, and that are registered with and in spatial communication with said first and second output sockets of said surrounding wall to receive said terminals of said first and second output components therein, respectively.

9. The combiner box as claimed in claim 1, wherein each of said first and second output components of said electrical connector unit is a connector allowing a cable having a core to be inserted therethrough so that the core is electrically connected to a respective one of said first and second output electrodes, said first input terminals are substantially perpendicular to said first input electrodes of said first electrode set, respectively, and said second input terminals are substantially perpendicular to said second input electrodes of said second electrode set, respectively.

10. The combiner box as claimed in claim 9, wherein:

said casing further includes a plurality of first input-connector jacks that are substantially perpendicular to and project from said surrounding wall outside of said accommodating space, and that are registered with and in spatial communication with said first input sockets of said surrounding wall, respectively, and a plurality of second input-connector jacks that are substantially perpendicular to and project from said surrounding wall outside of said accommodating space, and that are registered with and in spatial communication with said second input sockets of said surrounding wall, respectively; and said connector of each of said first and second output components includes a union nut that is substantially perpendicular to and projects from said surrounding wall outside of said accommodating space and that is registered with and in spatial communication with a respective one of said first and second output sockets of said surrounding wall to allow insertion of the cable, and a waterproof nut fittingly sleeved around said union nut for securing the cable received in said union nut.

11. The combiner box as claimed in claim 9, wherein said combiner module further includes a pair of clamping units for clamping and securing the cables to said first and second output electrodes, respectively, each of said clamping units including:

a fixed frame having at least two base plates mounted on a corresponding one of said first and second output electrodes, a pair of vertical plates each of which is connected perpendicularly to a corresponding one of said base plates and extends along the second direction, each of which is formed with a slot, and each of which has a top edge, and a top plate connected to said top edges of said vertical plates and formed with a through hole, said vertical plates and said top plate cooperatively defining a clamping space for receiving the core of the cable, said slots of said vertical plates and said through hole of said top plate being in spatial communication with said clamping space;

a slidable block including a block body fittingly disposed in said clamping space, and having a top surface that faces said top plate and that is formed with a threaded hole, and a pair of side surfaces that face said vertical plates, respectively, and a pair of slide rods projecting from said side surfaces of said block body and extending slidably into said slots of said vertical plates, respectively; and a bolt extending through said through hole in said top plate and being screwed into said threaded hole in said block body of said slidable block for moving said slidable block upwardly and downwardly in said clamping space with respect to said corresponding one of said first and second output electrodes and for urging said slidable block to press the core of the cable abutting against said corresponding one of said first and second output electrodes.

12. The combiner box as claimed in claim 1, wherein said casing further includes a cover plate removably covering on said surrounding wall to close said accommodating space.

13. The combiner box as claimed in claim 1, wherein said casing further includes a plurality of mounting plates projecting parallelly from said bottom wall and being formed with respective mounting holes allowing fasteners to extend therethrough for securing said combiner box.

\* \* \* \* \*